United States Patent
Shyu et al.

(10) Patent No.: US 7,557,402 B2
(45) Date of Patent: Jul. 7, 2009

(54) HIGH WRITE AND ERASE EFFICIENCY EMBEDDED FLASH CELL

(75) Inventors: Der-Shin Shyu, Hsinchu (TW); Hung-Cheng Sung, Hsinchu (TW); Chen-Ming Huang, Jhongli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 107 days.

(21) Appl. No.: 11/599,930

(22) Filed: Nov. 15, 2006

(65) Prior Publication Data
US 2007/0063248 A1    Mar. 22, 2007

Related U.S. Application Data

(62) Division of application No. 10/870,774, filed on Jun. 17, 2004, now Pat. No. 7,176,083.

(51) Int. Cl.
*H01L 29/34* (2006.01)
(52) U.S. Cl. .............. 257/314; 438/201; 438/257; 438/593; 257/E29.129; 257/E29.3
(58) Field of Classification Search .......... 438/201, 438/211, 257, 593; 257/314, E21.68, E29.129, 257/E29.3
See application file for complete search history.

(56) References Cited

U.S. PATENT DOCUMENTS

| 5,480,837 | A | 1/1996 | Liaw et al. |
| 6,017,795 | A | 1/2000 | Hsieh et al. |
| 6,046,086 | A | 4/2000 | Lin et al. |
| 6,124,609 | A | 9/2000 | Hsieh et al. |
| 6,136,657 | A | 10/2000 | Yang et al. |
| 6,406,961 | B1 | 6/2002 | Chen |
| 6,780,785 | B2 * | 8/2004 | Hsieh ............... 438/745 |
| 6,885,586 | B2 | 4/2005 | Chen et al. |
| 6,908,816 | B1 | 6/2005 | Thurgate et al. |
| 2004/0087084 | A1 * | 5/2004 | Hsieh ............... 438/257 |
| 2004/0241942 | A1 * | 12/2004 | Hsieh ............... 438/257 |
| 2004/0248367 | A1 * | 12/2004 | Shyu et al. ........ 438/257 |
| 2005/0054162 | A1 | 3/2005 | Hsieh et al. |
| 2005/0205922 | A1 | 9/2005 | Liu et al. |

* cited by examiner

*Primary Examiner*—Fernando L Toledo
(74) *Attorney, Agent, or Firm*—Slater & Matsil, L.L.P.

(57) ABSTRACT

An embedded flash cell structure comprising a structure, a first floating gate having an exposed side wall over the structure, a second floating gate having an exposed side wall over the structure and spaced apart from the first floating gate, a first pair of spacers over the respective first floating gate and the second floating gate, a second pair of spacers at least over the respective exposed side walls of the first and second floating gates, a source area in the structure between the second pair of spacers, a plug over the source implant, and first and second control gates outboard of the first pair of spacers and exposing outboard portions of the structure and respective drain areas in the exposed outboard portions of the structure is provided. A method of forming the embedded flash cell structure is also provided.

15 Claims, 6 Drawing Sheets

HIGH WRITE AND ERASE EFFICIENCY EMBEDDED FLASH CELL

This application is a divisional of patent application Ser. No. 10/870,774, entitled "High Write and Erase Efficiency Embedded Flash Cell," filed on Jun. 17, 2004 now U.S. Pat. No. 7,176,083, which application is incorporated herein by reference.

TECHNICAL FIELD

The present invention relates generally to semiconductor fabrication and more specifically to the formation of flash cells.

BACKGROUND

Source coupling ratio (SCr) is a common performance measurement for flash cells and particularly so-called split cells or split gate cells. A high source coupling ratio provides for higher erase speeds and a higher programming speed. As the dimensions of split cells decrease, however, the source coupling ratio tends to decrease as well. In conventional split cell design, if one increases the source junction width in order to increase the SCr, the relative channel length is proportionately reduced, resulting in increased punchthrough effects and poor program efficiency.

Various approaches have been attempted to increase the efficiency and performance of flash memory cells. U.S. Pat. No. 6,406,961 B1 to Chen describes a process for producing flash memory without misalignment of the floating gate with field oxide. U.S. Pat. No. 6,124,609 to Hsieh et al. describes a split gate flash memory with a buried source to shrink cell dimensions and increase the coupling ratio. U.S. Pat. No. 6,046,086 to Lin et al. describes a method to improve the capacity of data retention and increase the coupling ratio of the source to the floating gate in split-gate flash. U.S. Pat. No. 6,017,795 to Hsieh et al. also describes a method of fabricating a buried source to shrink cell dimensions and increase the coupling ratio in split-gate flash memories.

SUMMARY OF THE INVENTION

Accordingly, it is an advantage of one or more embodiments of the present invention to provide an improved embedded flash cell, and a method of making same. Other advantages will appear hereinafter.

It has now been discovered that the above and other advantages of the present invention may be accomplished in the following manner. Specifically, an embedded flash cell structure comprises the following: a first floating gate having an exposed side wall over a structure; a second floating gate having an exposed side wall over the structure and spaced apart from the first floating gate; a first pair of spacers over the respective first floating gate and the second floating gate; a second pair of spacers at least over the respective exposed side walls of the first and second floating gates; a source area in the structure between the second pair of spacers; a plug over the source implant; first and second control gates outboard of the first pair of spacers and exposing outboard portions of the structure and respective drain areas in the exposed outboard portions of the structure; and a method of forming the embedded flash cell structure.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF ILLUSTRATIVE EMBODIMENTS

Figure 1A:
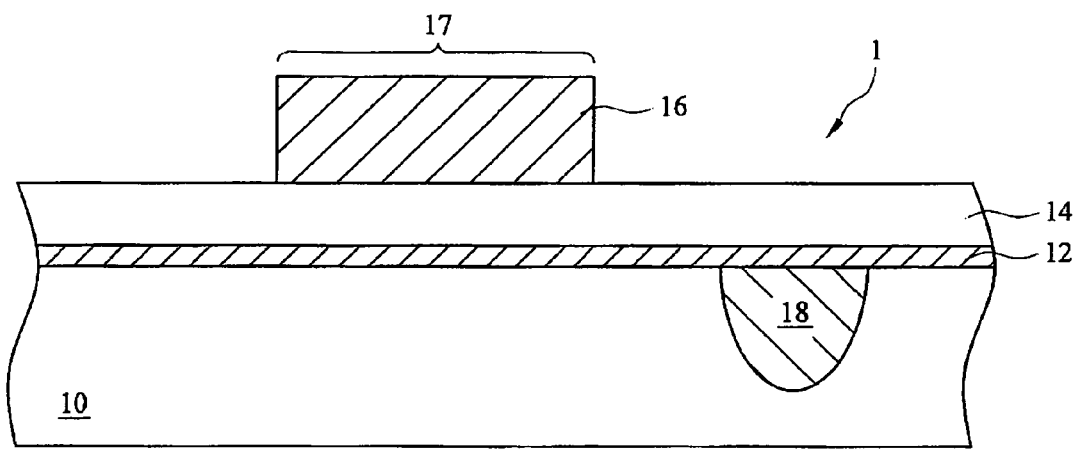
FIGS. 1 to 13 schematically illustrate exemplary manufacturing steps in a preferred embodiment method and apparatus of the present invention.
Figure 1:
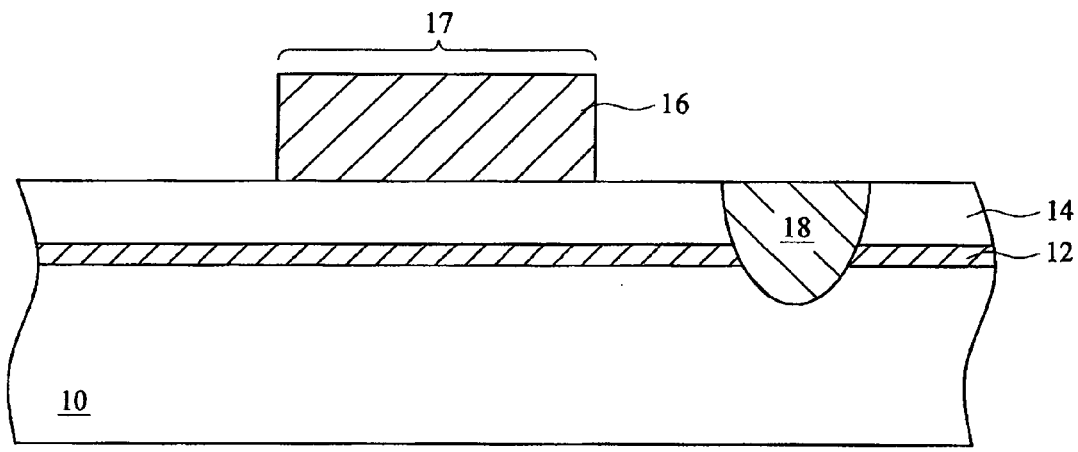

Initial Structure—FIG. 1

As shown in FIG. 1, structure 10 includes an oxide layer 12 having a thickness of preferably from about 10 to 200 Å and more preferably from about 70 to 100 Å formed thereover. Structure 10 is understood to possibly include a semiconductor wafer or substrate 10 that is preferably comprised of silicon or germanium and is more preferably a silicon substrate (either a bulk silicon wafer or a silicon-on-insulator "SOI" substrate) as will be used hereafter for purposes of illustration. It should be noted that the attached drawings are not to scale, that various features not essential to understanding the invention have been omitted for clarity, and that various other features have been drawn either in diminished scale or in exaggerated scale, as appropriate, to aid in understanding features of the illustrative embodiments of the present invention.

Oxide layer 12 is preferably comprised of silicon oxide. In one illustrative embodiment, oxide layer 12 is a thermally grown oxide, although other gate dielectrics and deposition processes may also be employed.

A polysilicon (poly) layer 14 is formed over oxide layer 12 to a thickness of preferably from about 200 to 2000 Å and more preferably from about 60 to 150 Å formed thereover.

FIG. 1 also illustrates that one or more shallow trench isolation (STI) structures 18 may be formed in substrate 10. As is known in the art, STI structures define active regions and electrically isolate portions of the integrated circuit. Typically, STI structures 18 are formed prior to deposition of oxide layer 12 and poly layer 14, as is illustrated in FIG. 1A. In preferred embodiments of the present invention, however, STI structure 18 is formed subsequent to the formation of oxide layer 12 and poly layer 14. Although the following discussion will reference the embodiment shown in FIG. 1, those skilled in the art will recognize that the following teachings apply equally to an embodiment employing the STI structure 18 illustrated in FIG. 1A.

A first masking layer 16 may be formed over the poly layer 14 to define a floating gate region 17. First masking layer 16 is preferably comprised of photoresist. A memory well one (1) (MW) photo implant (not shown) near the cell channel surface and a memory well two (2) (MW) implant (not shown) as a cell anti-punchthrough implant may then be performed. Additional implants, such as a cell implant, a halo implant and a floating gate implant (none shown) may also be performed.

Figure 2:
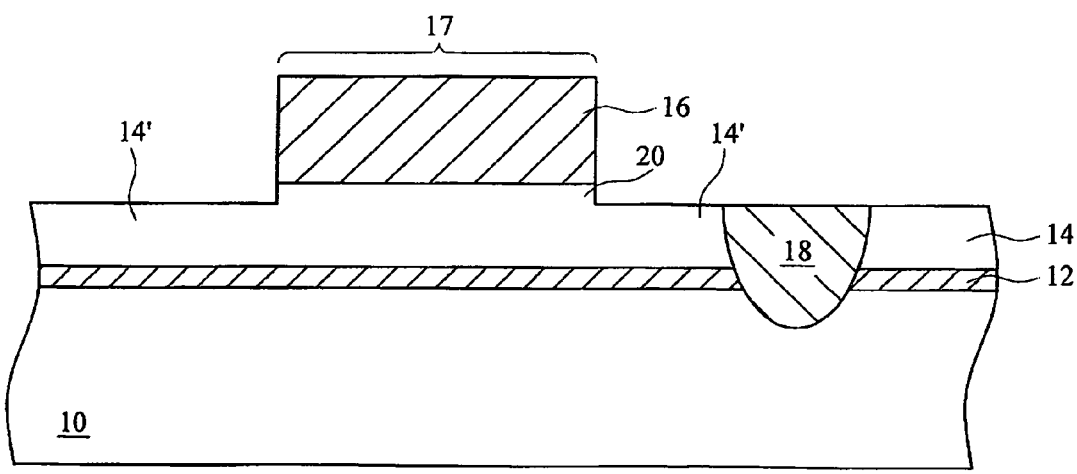

Partial Etching of Poly Layer 14 To Form Floating Gate Poly Portion 20—FIG. 2

As shown in FIG. 2, poly layer 14 is partially etched to form a thicker floating gate poly portion 20 flanked by thinner, partially etched portions 14' of poly layer 14. Poly layer 14 may be partially etched by, for example, using first masking layer 16 as a mask. Poly etching may be accomplished in a variety of manners, preferably by using a dry etch to avoid undercutting effects under the mask 16. Thinner, partially etched poly portions 14' each preferably have a thickness of preferably from about 400 to 1200 Å and more preferably from about 500 to 1000 Å formed thereover. The thickness of the resulting etched portions 14' can be readily controlled by careful control of the etch parameters and time, as will be understood by one of ordinary skill in the art.

Figure 3:
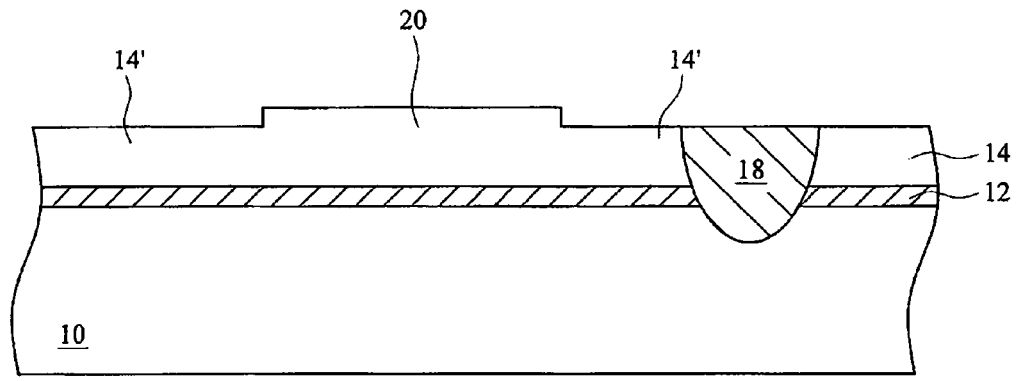

Removal of First Masking Layer 16—FIG. 3

As shown in FIG. 3, first masking layer 16 is removed and the structure of FIG. 3 is cleaned as necessary/appropriate.

Figure 4:
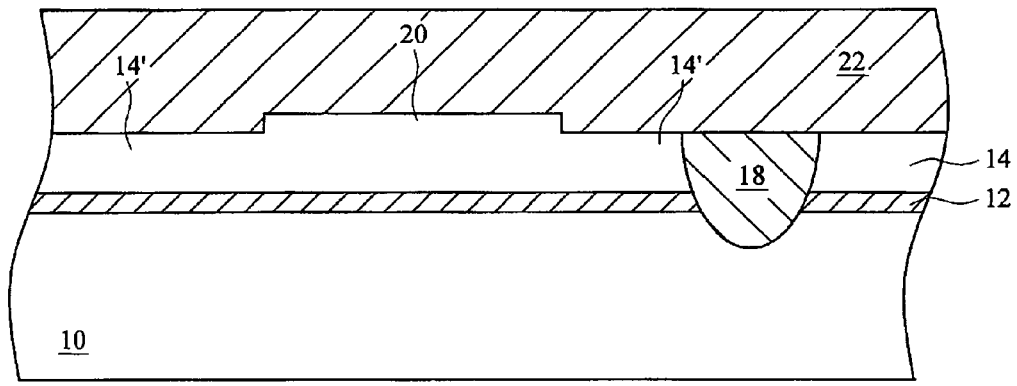

Formation of Second Masking Layer 22—FIG. 4

As shown in FIG. 4, a second masking layer 22 is formed over the structure of FIG. 3 to a thickness of preferably from about 1000 to 6000 Å and more preferably from about 3000 to 5000 Å. Second masking layer 22 is preferably comprised of silicon nitride ($Si_3N_4$ or SiN), although other masking materials such as silicon oxynitride and the like could be employed, providing the selected material has a sufficient etch selectively relative to polysilicon layer 14, as will be explained in greater detail below.

Figure 5:
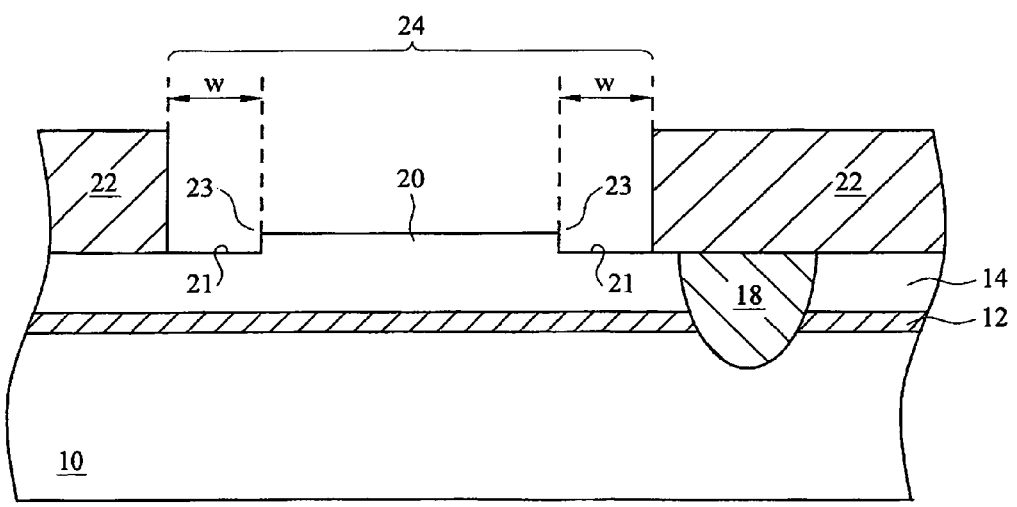

Patterning of SiN Masking Layer 22—FIG. 5

As shown in FIG. 5, SiN masking layer 22 is patterned to form an opening 24 exposing floating gate poly portion 20 and regions 21 of the partially-etched portions 14' of poly layer 14 adjacent to the exposed floating gate poly portion 20. Each of the exposed poly layer regions 21 has a width "w" of preferably from about 2000 to 8000 Å and more preferably from about 4000 to 6000 Å. It is noted that exposed floating gate poly portion 20 has essentially sharp, 90° corners 23.

Figure 6:
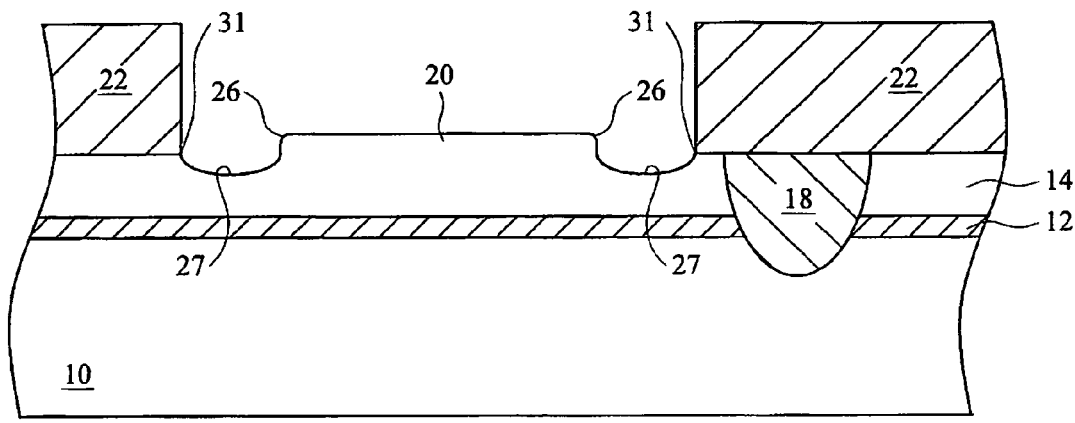

Formation of Sloped Corners 26 of Exposed Floating Gate Poly Portion 20—FIG. 6

As shown in FIG. 6, the structure of FIG. 5 is subjected to a poly etch, preferably a dry isotropic etch process, that: (1) rounds the sharp corners 23 of exposed floating gate poly portion 20 to form rounded corners 26; and (2) partially removes preferably from about 100 to 200 Å of the exposed portions 21 of the partially-etched portions 14' of poly layer 14 to form rounded portions 27 sharpening the tips 31 of the rounded portions 27. The tips 31 will provide a region of high electric field intensity between floating gate 34, 36 and subsequently formed control gates 70, 72 (see FIG. 13), respectively. This improves device performance during a cell erase step. On the other hand, it is desirable to disperse the electric field intensity between floating gates 34, 36 and subsequently formed poly spacers 42 (see FIG. 12) during a cell program operation. Rounding the corners 26 thus improves the device programming operation.

Figure 7:
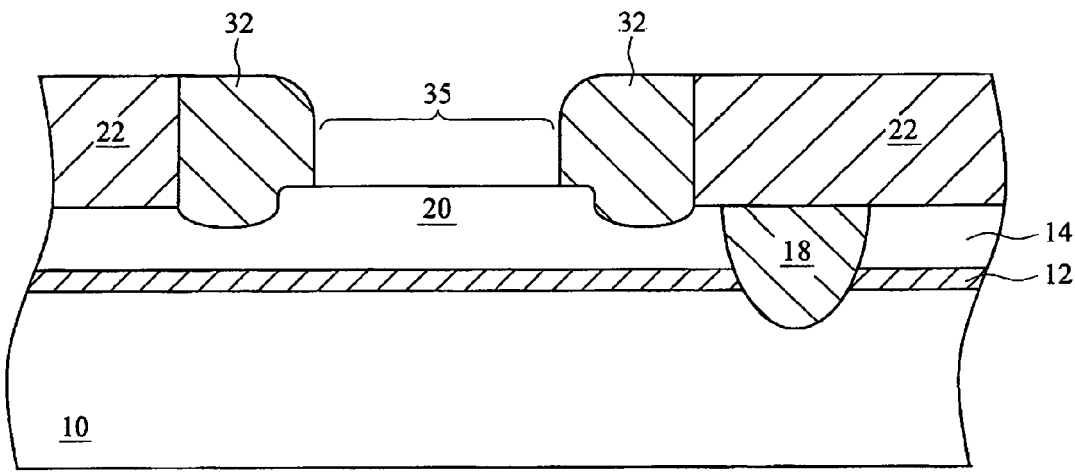

Formation of Spacers 32—FIG. 7

As shown in FIG. 7, spacers 32 are formed over the exposed side walls of patterned SiN masking layer 22 within opening 24 (shown in FIG. 5). Spacers 32 also cover respective rounded portions 27 and rounded corners 26, leaving exposed a central portion 35 of floating gate poly portion 20.

Spacers 32 are preferably comprised of tetraethoxysilane (TEOS) or high temperature oxide (HTO) and are more preferably tetraethoxysilane (TEOS) as will be used for illustrative purposes hereafter. TEOS spacers 32 may be formed, for example, by depositing a layer of TEOS over the structure of FIG. 6, at least filling opening 24, and then anisotropically etching the TEOS layer back, using, e.g., plasma etch, HF etch, or the like.

Figure 8:
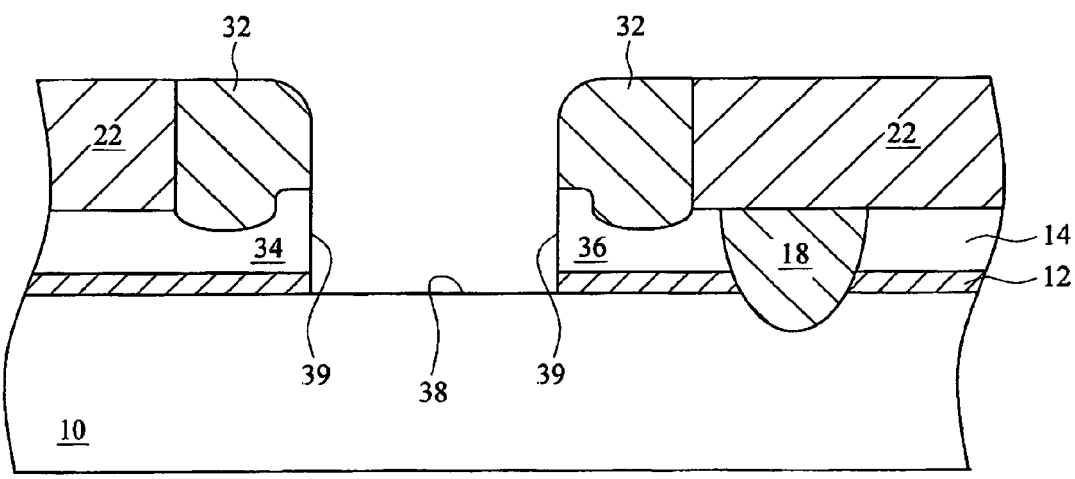

Etching of Floating Gate Poly Portion 20 To Form A First And Second Floating Gate 34,36—FIG. 8

As shown in FIG. 8, using TEOS spacers 32 as masks, the exposed portion 35 of floating gate poly portion 20 and the underlying portion of oxide layer 12 are etched to expose a portion 38 of substrate 10. Note that a pair of floating gates 34, 36 is thus formed because floating gate poly portion 20 is effectively cleaved into two separate, electrically isolated gates. Floating gates 34, 36 have respective exposed side wall portions 39 as shown in FIG. 8.

Figure 9:
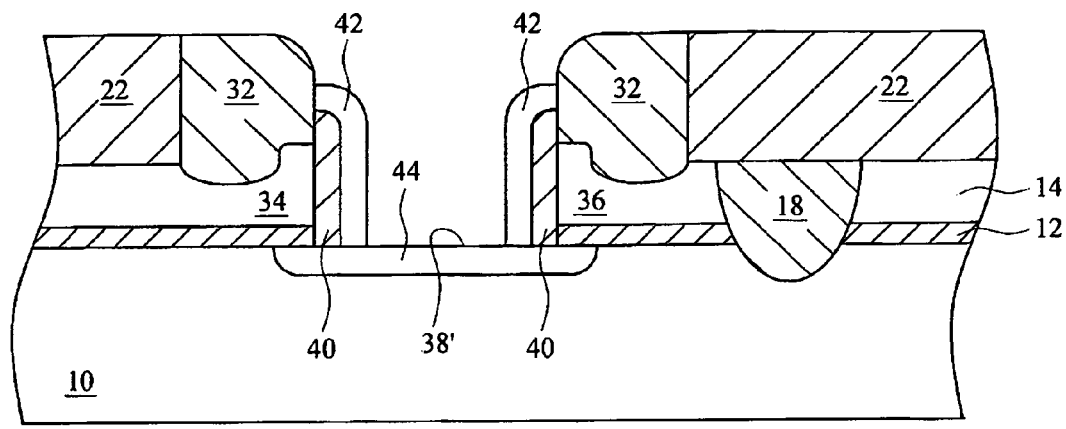

Formation of Dielectric Spacers 40 and Poly Spacers 42—FIG. 9

Figure 9A:
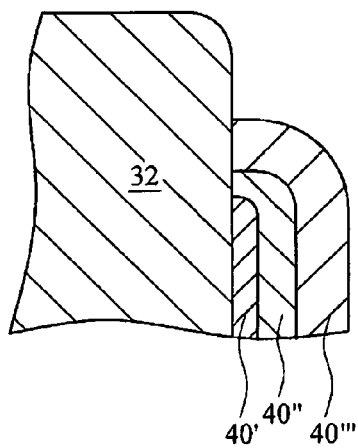

FIG. 9 illustrates the central portion of FIG. 8 in greater detail to assist in understanding the advantageous features of the illustrative embodiments of the invention. As shown in FIG. 9, a respective first pair of floating gate dielectric spacers 40 are formed over the exposed sidewalls 39 of floating gates 34, 36 and a portion of the sidewalls' respective TEOS spacers 32. Dielectric spacers 40 are preferably formed to a total width of preferably from about 50 to 2000 Å and more preferably from about 60 to 1000 Å. As illustrated in detail in FIG. 9A, dielectric spacers 40 are preferably comprised of an oxide/nitride/oxide sandwich (ONO) having: an inner oxide layer 40' of preferably from about 10 to 100 Å thick and more preferably from about 30 to 80 Å; a middle nitride layer 40" of preferably from about 10 to 150 Å thick and more preferably from about 30 to 90 Å; and an outer oxide layer 40''' of preferably from about 10 to 250 Å thick and more preferably from about 40 to 100 Å. As will be appreciated by those skilled in the art, the ONO structure is typically formed by a conformal deposition of a first oxide layer, preferably followed by an anisotropic etch of the oxide layer to form oxide layer 40'. This is followed by a conformal deposition of a nitride layer, such as by CVD, PECVD, or the like, followed by an anisotropic etch of the nitride layer, resulting in the nitride layer 40". This is followed by a conformal deposition and anisotropic etch back of a second oxide layer to form oxide layer 40'''. In other embodiments, dielectric spacers may be formed of only one or more oxide layers, only one or more nitride layers, and/or some other combination of oxide, nitride, and/or possibly other dielectric (e.g., polymer) layers.

Poly spacers 42 are then formed over the ONO spacers 40 to a width of preferably from about 100 to 1500 Å and more preferably from about 500 to 1000 Å. The poly spacers 42 are preferably comprised of polysilicon (poly), which is conformally deposited, such as by a CVD process, and anisotropically etched back. As will be described in greater detail below, the poly spacers 42 form part of the $V_{ss}$ poly plug and will protect the dielectric spacers 40 from etching damage during subsequent processing steps. This, in turn, will contribute to good data retention because of the improved integrity and isolation performance of the dielectric spacers 40.

The formation of dielectric spacers 40 and poly spacers 42 leaves exposed a reduced exposed portion 38' of silicon substrate 10 between the first and second floating gates 34, 36 (or more precisely, between the poly spacers 42).

Using poly spacers 42 as implant masks, a source ($V_{SS}$) region 44 is implanted into the underlying silicon substrate 10 (using, e.g., As, P, B, An, and the like). Poly spacers 42 and dielectric spacers 40 protect the floating gate oxide (i.e., dielectric layer 12) from damage during the source ($V_{SS}$) ion implant. The spacers also allow for the cell channel region to be longer to avoid or at least minimize short channel effects. As illustrated in FIG. 9, source implant region 44 extends beyond the lateral boundaries defined by the poly spacers 42. The structure is illustrated in this manner to recognize the fact that the implanted impurities will diffuse out during subsequent processing steps, as is well known in the art.

It is noted that the poly spacers 42 are also implanted with the $V_{SS}$ implant to preferably from about $10^{13}$ to $10^{16}$ atoms/$cm^2$. As noted above, this serves to protect the dielectric spacers 40 and floating gate oxide 12.

Figure 10:
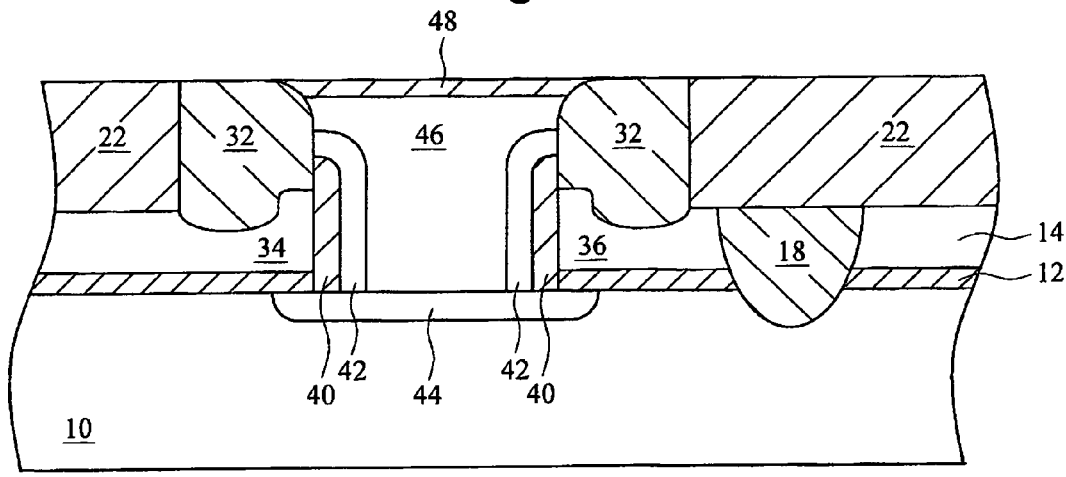

Formation of Plug 46 and Overlying Dielectric Layer 48 FIG. 10

As shown in FIG. 10, plug material is formed over the structure of FIG. 9, at least filling the opening between the opposing TEOS spacers 32, and then planarized, preferably by chemical mechanical polishing (CMP) and/or an etch back process, to form plug 46, also referred to herein as $V_{ss}$ poly or $V_{ss}$ poly plug. Plug 46 is preferably comprised of polysilicon (poly). In other embodiments, plug 46 could comprise some other suitable conductive material, such as tungsten, aluminum, copper, or the like.

Poly plug 46 is subjected to an additional ion implant after the $V_{ss}$ poly deposition, CMP and etch back, i.e., a $V_{ss}$ implant. This implant step will cause damage to the poly surface, resulting in a thicker oxide in the oxidation step, which will protect the $V_{ss}$ poly plug 46 in the following etching step.

A dielectric layer 48 is then formed over the upper exposed surface of poly plug 46 to a thickness of preferably from about 50 to 500 Å and more preferably from about 160 to 300 Å. Dielectric layer 48 is preferably comprised of oxide or silicon oxide and is more preferably oxide formed by the oxidation of poly plug 46. Oxide film/dielectric layer 48 will protect $V_{ss}$ poly plug 46 during subsequent processing steps described in greater detail below.

Figure 11:
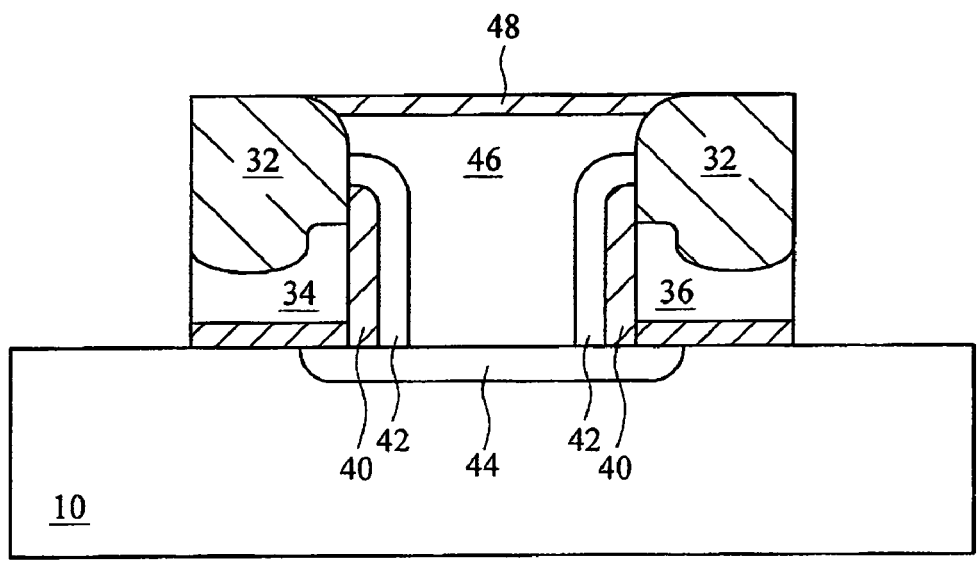

Stripping of Patterned SiN Masking Layer 22'—FIG. 11

As shown in FIG. 11, patterned SiN masking layer 22 is removed from the structure of FIG. 10, preferably by stripping using a conventional silicon nitride stripping process, such as $H_3PO_4$ as an example. Note that the portions of poly layer 14 and oxide layer 12 underlying the SiN masking layer 22 are also removed during this step. In some embodiments, these layers are removed in a single etch process step. In other embodiments, however, because of the high etch selectivity typically seen between nitride, poly, and oxide, one or more etch processes may be needed to effectively and efficiently remove all three layers. Furthermore, the illustrated embodiment provides the added advantage that poly layer 14 and/or oxide layer 12 may act as an etch stop for the nitride layer 22 etch, thus minimizing the risk of damage to the underlying surface of substrate 10 caused by over-etching. As will be appreciated by those skilled in the art, the etch step(s) is/are typically followed by cleaning as necessary/appropriate. At this stage, split floating gates 34 and 36 are fully formed.

Note that three main process steps are performed to define the isolated floating gates. In the first exemplary process step, the floating gates are defined in a first direction (the so-called "x-direction") by the formation of STI structures 18, which define the active areas (also known as oxide definition or OD). The two floating gates (in a given cell) are electrically isolated from each another by etching through the thick floating gate poly region 20. Finally, each floating gate is electrically isolated from adjacent cell gates by etching through the thin partially etched portions 14' of the poly layer 14.

Figure 12:
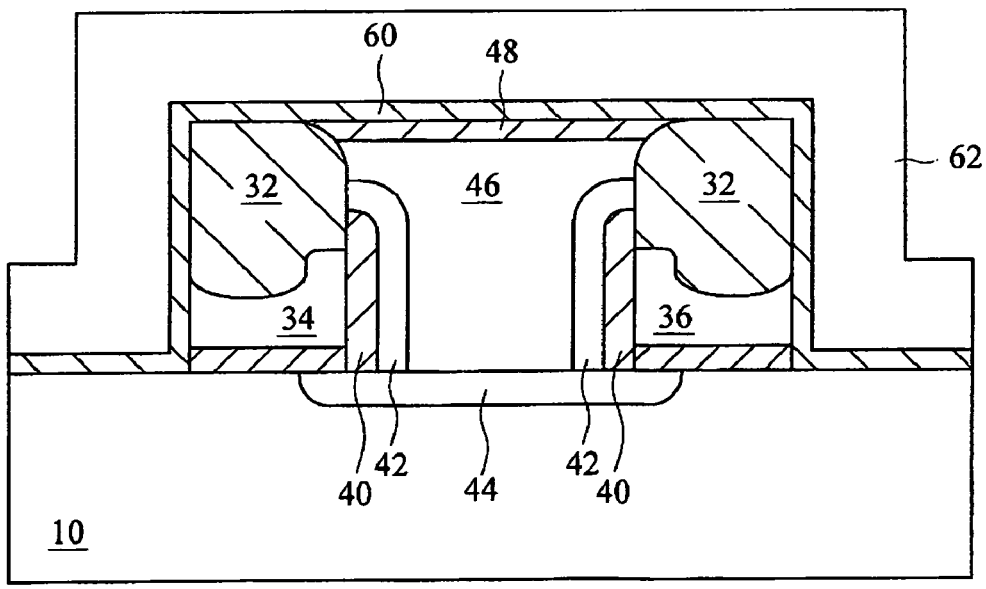

High-Temperature Oxide (HTO) Layer 60 Formation And Outer Conductive Layer 62 Deposition—FIG. 12

As shown in FIG. 12, a thin dielectric layer 60 is formed over the entire structure of FIG. 11. Preferably, layer 60 is formed to a maximum thickness of preferably from about 100 to 200 Å and more preferably from about 130 to 160 Å. Layer 60 is preferably an oxide deposited using a high temperature oxide (HTO) deposition process, as is known in the art. Other deposition processes and other dielectric materials could be used in lieu of HTO layer 60, however, provided they offer sufficient dielectric and permittivity properties to function as a gate dielectric.

An outer conductive layer 62 is formed over the dielectric layer 60 to a thickness of preferably from about 100 to 3000 Å and more preferably from about 1000 to 2400 Å. Outer conductive layer 62 is preferably comprised of polysilicon, although other conductive materials could be employed, including metals and poly/metal silicides.

Figure 13:
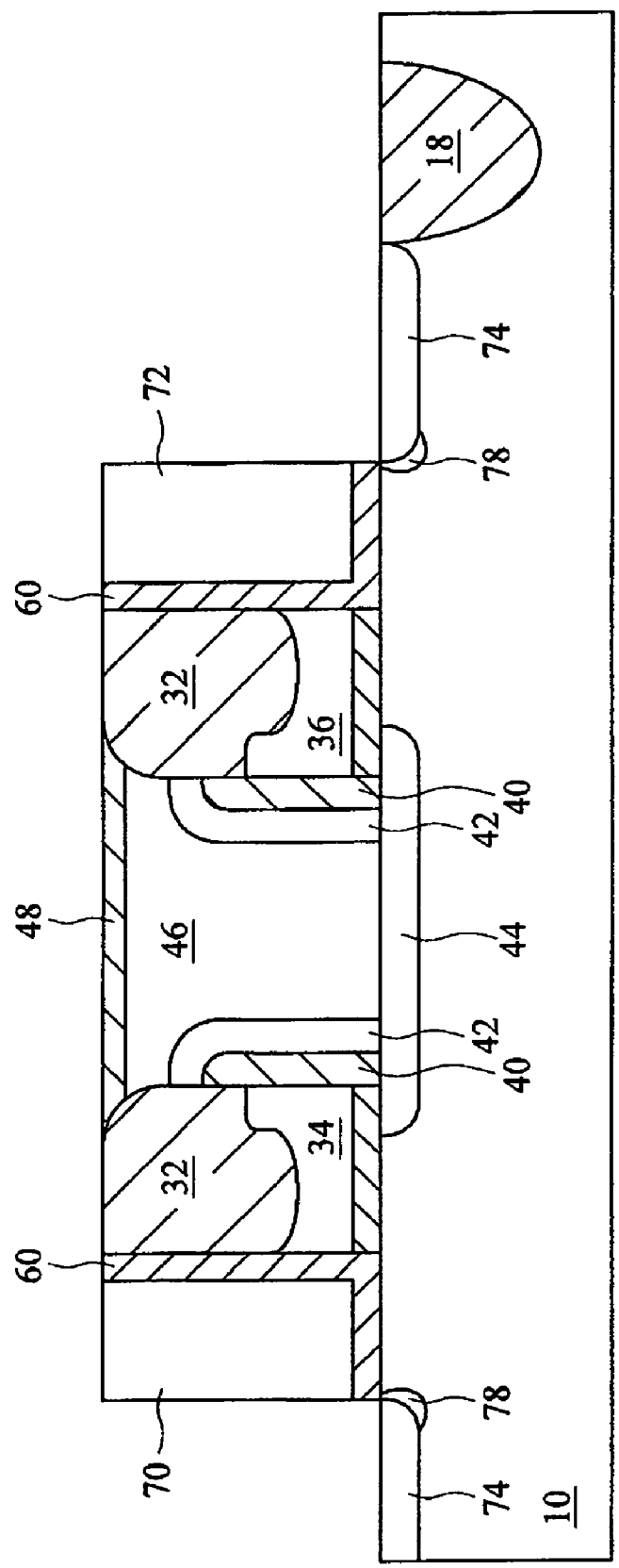

Formation of Control Gates 70, 72—FIG. 13

As shown in FIG. 13, the outer conductive/poly layer 62 and the underlying HTO layer 60 are patterned into control gates 70, 72 for the first floating gate 34 and the second floating gate 36, respectively.

Halo implants 78 are then formed as shown in FIG. 13, as well as respective drain implants 74, 76. Although not illustrated in FIG. 13, various other features, such as lightly doped drain features, deep junction features, graded junction features, and the like, may be implanted as well. Additionally, control gates 70 and 72 may be doped during one or more of the above described ion implantation steps. Further processing may then proceed.

Advantageous features of the illustrative embodiments of the present invention include a relatively high source coupling ratio, in part because of the extensive cross-sectional area of interface between the floating gates 34, 36, and the $V_{ss}$ plug 46. This allows for high erase speed and high programming speed. Other advantageous features of the illustrative embodiments are that high endurance and reliability are provided, at least in part, by the protective poly spacers 42 and dielectric spacers 40.

Note that the above described figures actually illustrate the formation and structure of two memory cells sharing a common source. The first memory cell includes drain region 74, control gate 70, floating gate 34 and shared source 44. The second memory cell includes shared source 44, floating gate 36, control gate 72, and drain 76. In other embodiments of the present invention, it is envisioned that a single, annularly shaped memory cell could be manufactured in which each of the illustrated feature pairs (e.g., 70/72, 34/36, 74/76) are cross sectioned views of a single respective feature.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. For instance, although the gate dielectrics were described with respect to oxides, other high k dielectric materials, including nitrided oxides and tantalum oxides, could be employed. Likewise, metals, conductive polymers, or other conductive materials could be substituted for the various conductive features, such as the above described floating gates and control gates. The source and drain regions were disclosed as being formed by ion implantation. These regions could alternatively be formed by, e.g., epitaxial growth of silicon, germanium, or various other semiconductor materials or combinations of semiconductor materials. Routine experimentation may reveal that other deposition techniques, be they chemical vapor deposition (CVD), plasma enhanced chemical vapor deposition (PECVD), atomic layer deposition (ALD), and the like are practicable substitutes for the illustrated embodiments. Likewise, etching may be accomplished via wet etch, dry etch, reactive ion etching (RIE), plasma etching, and the like, where appropriate, in lieu of the above described processes.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

While particular embodiments of the present invention have been illustrated and described, it is not intended to limit the invention, except as defined by the following claims.

What is claimed is:

1. An embedded flash cell structure, comprising:
    a substrate;
    a first floating gate formed on said substrate and having an exposed side wall over the structure;
    a second floating gate having an exposed side wall over the structure and spaced apart from the first floating gate;
    a first pair of spacers over the respective first floating gate and the second floating gate;
    a second pair of spacers at least over the respective exposed side walls of the first and second floating gates;
    a source implant area in the substrate between the second pair of spacers;
    a plug over the source implant area, between the first pair of spacers, and between the second pair of spacers;
    first and second control gates outboard of the first pair of spacers; and
    respective drain areas in the substrate formed adjacent said respective first and second control gates.

2. The structure of claim 1, wherein the first and second floating gates each have a rounded corner.

3. The structure of claim 1, including a third pair of spacers over the second pair of spacers.

4. The structure of claim 1, including a third pair of spacers over the second pair of spacers, and wherein the source area is between:
    the third pair of spacers; and
    the first pair of spacers.

5. The structure of claim 1, wherein the first and second floating gates are comprised of polysilicon, the first pair of spacers are comprised of tetraethoxysilane (TEOS) or high temperature oxide (HTO), the second pair of spacers are comprised of an oxide/nitride/oxide sandwich (ONO), and the plug is comprised of polysilicon (poly).

6. The structure of claim 1, wherein the second pair of spacers have a total width of from about 50 to 2000 Å.

7. The structure of claim 1, wherein the second pair of spacers have a total width of from about 60 to 1000 Å.

8. The structure of claim 1, including a floating gate oxide layer underneath the first and second floating gates.

9. The structure of claim 1, including a floating gate oxide layer underneath the first and second floating gates, the floating gate oxide layer having a thickness of from about 10 to 200 Å.

10. A split gate flash cell, comprising:
    a semiconductor substrate having a source area and a drain area;
    at least one L-shaped floating gate overlying the source area, the L-shaped floating gate having at least one sidewall disposed on the side of the L-shaped floating gate proximate the source area;
    a first sidewall spacer adjacent and contacting said at least one sidewall;
    a second sidewall spacer adjacent and contacting said first sidewall spacer;
    a control gate outboard the L-shaped floating gate; and
    a conductive line electrically connected to the source area by a plug formed adjacent the second sidewall spacer.

11. The split gate flash cell of claim 10 further comprising a gate dielectric layer proximate the L-shaped floating gate.

12. The split gate flash cell of claim 10, wherein said first sidewall spacer is a composite spacer.

13. The split gate flash cell of claim 12, wherein said composite spacer comprises an oxide layer.

14. The split gate flash cell of claim 10, wherein said first sidewall spacer comprises an oxide and said second sidewall spacer comprises polysilicon.

15. The split gate flash cell of claim 14, wherein said second sidewall spacer further includes an implanted impurity.

* * * * *